United States Patent
Aida et al.

(10) Patent No.: US 9,656,619 B2
(45) Date of Patent: May 23, 2017

(54) POWER SUPPLY DEVICE, AND IN-VEHICLE ILLUMINATION DEVICE USING SAME

(71) Applicant: Panasonic Intellectual Property Management Co., Ltd., Osaka (JP)

(72) Inventors: Takashi Aida, Niigata (JP); Kenichi Takamatsu, Niigata (JP); Yoshiyuki Inada, Niigata (JP); Hiroyuki Matsumoto, Niigata (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 266 days.

(21) Appl. No.: 14/436,661

(22) PCT Filed: Oct. 22, 2013

(86) PCT No.: PCT/JP2013/006225
§ 371 (c)(1),
(2) Date: Apr. 17, 2015

(87) PCT Pub. No.: WO2014/064918
PCT Pub. Date: May 1, 2014

(65) Prior Publication Data
US 2016/0167604 A1    Jun. 16, 2016

(30) Foreign Application Priority Data

Oct. 22, 2012    (JP) .................. 2012-232817

(51) Int. Cl.
*B60R 16/03*    (2006.01)
*B60Q 1/00*    (2006.01)
(Continued)

(52) U.S. Cl.
CPC ............ *B60R 16/03* (2013.01); *B60Q 1/0088* (2013.01); *B60Q 1/0094* (2013.01); *B60Q 1/04* (2013.01);
(Continued)

(58) Field of Classification Search
CPC ...... B60Q 1/04; B60Q 1/0088; B60Q 1/0094; B60R 16/03; F21V 23/023; H05B 33/0803; H05K 7/1427
See application file for complete search history.

(56) References Cited

U.S. PATENT DOCUMENTS

| 8,235,553 B2* | 8/2012 | Minami | ............... B60Q 1/0094 362/263 |
| 9,287,799 B2* | 3/2016 | Takamatsu | ............... H02M 7/44 |
| 2011/0280035 A1 | 11/2011 | Minami et al. | |

FOREIGN PATENT DOCUMENTS

| JP | 2000-091045 A | 3/2000 |
| JP | 2002-367413 A | 12/2002 |

(Continued)

OTHER PUBLICATIONS

International Search Report for corresponding International Application No. PCT/JP2013/006225 mailed Jan. 14, 2014.

(Continued)

*Primary Examiner* — Stephen F Husar
(74) *Attorney, Agent, or Firm* — Renner, Otto, Boisselle & Sklar, LLP

(57) ABSTRACT

Provided is a printed circuit board (1) on which the power supply circuit is mounted and a casing (2) which is shaped like a flat as a whole and in which the printed circuit board (1) is housed. An input terminal (11) of the power supply circuit is connected to an input socket (3) fixed to one end part, in a direction perpendicular to a thickness direction of the printed circuit board (1), of the casing. An output terminal (12) of the power supply circuit is connected to an output socket (4) protrudes from one side, in the thickness direction of the printed circuit board (1), of the casing (2). The casing (2) has a bulge part (21) which protruded to an (Continued)

opposite side to the protruding side of the output socket (5) and to which the input socket (3) is fixed.

6 Claims, 3 Drawing Sheets

(51) Int. Cl.
*H05B 33/08* (2006.01)
*B60Q 1/04* (2006.01)
*F21V 23/02* (2006.01)
*H05K 7/14* (2006.01)

(52) U.S. Cl.
CPC ....... *F21V 23/023* (2013.01); *H05B 33/0803* (2013.01); *H05K 7/1427* (2013.01)

(56) References Cited

FOREIGN PATENT DOCUMENTS

| | | |
|---|---|---|
| JP | 2003-258454 A | 9/2003 |
| JP | 4727001 B2 | 4/2011 |
| JP | 2011-217547 A | 10/2011 |
| JP | 2012-113832 A | 6/2012 |

OTHER PUBLICATIONS

Form PCT/ISA/237 for corresponding International Application No. PCT/JP2013/006225 dated Jan. 14, 2014.

\* cited by examiner

POWER SUPPLY DEVICE, AND IN-VEHICLE ILLUMINATION DEVICE USING SAME

TECHNICAL FIELD

The present invention relates to a power supply device and an in-vehicle illumination device with the power supply device.

BACKGROUND ART

So far there has been proposed, as an in-vehicle power supply device for lighting a headlight, a power supply device configured to be fixed under a lamp body in which a light source is housed (for example, see JP4727001B).

This type of power supply device includes: a printed circuit board on which a power supply circuit configured to convert an input power from an external power source into a suitable power to light a light source is mounted; and a casing which is made of metal and houses the printed circuit board. In a case where a high-intensity discharge lamp is employed as the light source, for example, the power supply circuit includes an inverter circuit configured to generate an AC power to keep lighting the light source.

The power supply device further includes: an input socket used for the connection to the power source; and an output socket used for the connection to the light source. Specifically, the input socket is configured to be connected to an input plug provided on a second end of an input cable of which first end is connected to the power source. Also, the output socket is configured to be connected to an output plug provided on a second end of an output cable of which first end is connected to the light source.

The printed circuit board is disposed so that a thickness direction thereof corresponds to the vertical direction. The casing is formed to be thin shape in the vertical direction. The output socket is fixed to an upper wall of the casing, and the input socket is fixed to a side face of the casing.

As seen from the vertical direction, the casing is smaller than the lamp body in the dimension, and thus the input socket fixed to the side face of the casing should be located under the lamp body. Therefore, in order to avoid interference between the input socket and the lamp body, the input socket is disposed so as not to further protrude upwards than an upper face of the casing (i.e., so as not to further protrude to the lamp body side than a face, facing the lamp body, of the casing).

Downsizing of the input socket is difficult due to need for securing the waterproof property. Therefore, the total size of the casing is agreed with the size of the input socket so that the whole of a bottom of the casing is positioned lower than a lower face of the input socket. This leads to increase the size of the casing.

SUMMARY OF INVENTION

The present invention has been achieved in view of the above circumstances, and an object thereof is to provide a power supply device capable of having a smaller size and an in-vehicle illumination device using the power supply device.

A power supply device of the invention includes a printed circuit board, a casing, an input socket and an output socket. A power supply circuit is mounted on the printed circuit board. The printed circuit board is housed in the casing. The input socket is fixed to one end part, in a direction perpendicular to a thickness direction of the printed circuit board, of the casing. The input socket is electrically connected to an input terminal of the power supply circuit. The output socket is electrically connected to an output terminal of the power supply circuit. The output socket protrudes from one side, in the thickness direction of the printed circuit board, of the casing. A bulge part is provided on the one end part of the casing to further protrude therefrom than rest of the casing towards the opposite side to the output connector. The input socket is fixed to the bulge part.

In the power supply device, desirably, the input socket is fixed to the casing by a screw that engages with the casing. The casing is provided with a rotation-inhibition-protrusion configured to be brought into contact with the input socket to inhibit the input socket from rotating when the screw is fastened.

In the power supply device, desirably, the casing is made of metal. A gap is provided between a conductive part, electrically connected to the printed circuit board, of the input socket and an inner surface of the bulge part so that the gap has a sufficient dimension securing electrical insulation between the conductive part and the casing.

In the power supply device, desirably, the power supply circuit is configured to output an AC power for lighting a discharge lamp.

In the power supply device, desirably, the power supply circuit is configured to output a DC power for lighting a light-emitting diode.

An in-vehicle illumination device of the invention includes: any of the power supply device; a light source configured to be lit by an output of the power supply device; and a lamp body which is fixed to the casing and which houses the light source and into which the output socket is inserted.

By the invention, all part of the casing that is required to have the dimension agreed with the dimension of the input socket is the bulge part only. Accordingly, it is possible to reduce the size of the casing compared to a case where whole dimension of a casing is agreed with the dimension of the input socket.

DESCRIPTION OF EMBODIMENTS

Hereinafter, a best mode for implementing the invention is explained with reference to drawings.

Figure 1:
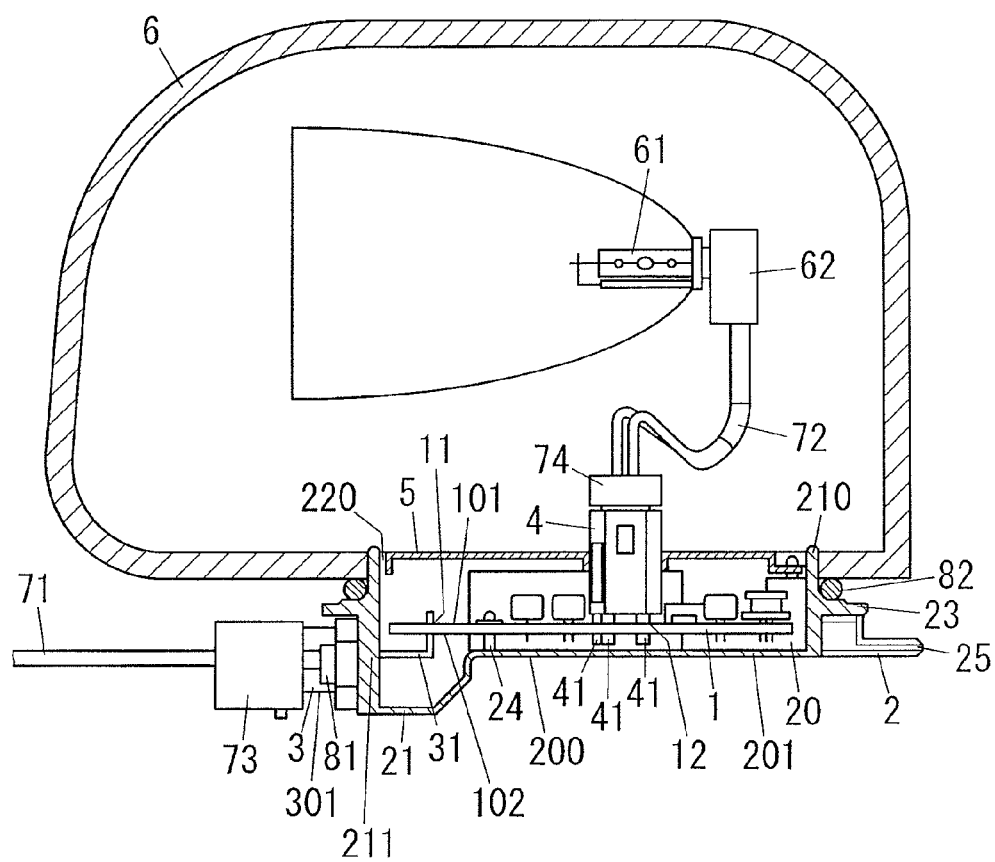
FIG. 1 is a sectional view of a light body and a power supply device connected thereto according to an embodiment of the invention.

As shown in FIG. 1, a power supply device of the embodiment is an in-vehicle power supply device (a headlight lighting device) fixed to a lamp body 6 of a headlight and configured to light a light source 61 housed in the lamp body 6. The power supply device constitutes an in-vehicle illumination device (a headlight device) together with the lamp body 6 and the light source 61.

The power supply device of the embodiment includes a printed circuit board 1 on which a power supply circuit is mounted, and a casing 2 which houses the printed circuit board 1. The power supply circuit has an input terminal 11 and an output terminal 12.

The casing 2 has a bottom 200, and an opening 220 to be inserted into the lamp body 6. The printed circuit board 1 has a first face 101 and a second face 102 on both sides in a thickness direction thereof. The printed circuit board 1 is housed in the casing 2 with the second face 102 facing the bottom 200 as well as with the first face 101 directed to a side of the opening 220.

The power supply device of the embodiment further includes an input socket 3 and an output socket 4. The input socket 3 is fixed to the casing 2 at one end part, in a direction perpendicular to the thickness direction of the printed circuit board 1, of the casing 2, and is electrically connected to the input terminal 11 of the power supply circuit 1. The output socket 4 is electrically connected to the output terminal 12 of the power supply circuit, and protrudes from one side, in the thickness direction of the printed circuit board 1, of the casing 2.

Also, the power supply device of the embodiment includes a cover 5 attached to the casing 2 so as to close the opening 220. The output socket 4 is attached to the first face 101 of the printed circuit board 1. The cover 5 has an insertion hole 50 through which the output socket 4 is inserted. The output socket 4 protrudes from the cover 5 through the insertion hole 50.

A bulge part 21 is provided on one end part, in the direction perpendicular to the thickness direction of the printed circuit board 1, of the bottom 200 of the casing 2 to further protrude therefrom than the rest of the bottom 200 of the casing 2. The input socket 3 is fixed to the bulge part 21.

Hereinafter, the power supply device of the embodiment is explained in further detail.

As shown in FIG. 1, the power supply device of the embodiment is configured to be attached on a lower side of the lamp body 6. Specifically, the power supply device of the embodiment is attached to the lamp body 6 with the first face 101 of the printed circuit board 1 directed upwards as well as with the second face 102 directed downwards. In the embodiment, the input socket 3 is fixed to the casing 2 at one end part, in a horizontal direction perpendicular to a vertical direction, of the casing 2. The output socket 4 protrudes upwards from the casing 2 (the cover 5).

As shown in FIGS. 1 to 4, the embodiment includes the printed circuit board 1 with its thickness direction agreed with the vertical direction, and the casing 2 in which the printed circuit board 1 is housed.

The power supply circuit is mounted on the printed circuit board 1. The power supply circuit is configured to convert a power, which is input from an external power source (not shown), into a desired power to light the light source 61. The light source 61 includes a high-intensity discharge lamp, for example. In this case, for example, the power supply circuit includes a DC-DC converter and an inverter. The DC-DC converter is configured to convert a DC voltage, which is input from an in-vehicle battery as the external power source, into a predetermined voltage. The inverter is configured to convert the output power of the DC-DC converter into an AC power. An igniter 62, which is a known component, configured to generate a high-voltage for initiating the light source 61 is also housed in the lamp body 6. Alternatively, the light source 61 includes a light-emitting diode. In this case, for example, the power supply circuit includes a DC-DC converter configured to perform a feedback operation so that the current value of its output DC current is kept constant (namely, perform a constant-current operation), and the igniter 62 is not provided.

The casing 2 is made of metal such as aluminum, for example, and has a housing recess 20 with an opened upper face. The printed circuit board 1 is housed in the housing recess 20. The casing 2 is thinned in the vertical direction, as a whole. That is, a thickness direction of the casing 2 corresponds to the thickness direction of the printed circuit board 1. The casing 2 is formed by die-cast molding, for example. The printed circuit board 1 is fixed to the casing 2 by, for example, being screwed to a countersink portion 24 which protrudes upwards from an inner bottom face of the housing recess 20.

As described above, the power supply device of the embodiment includes the input socket 3 fixed to a side face (a left face in FIG. 1) of the casing 2 with screws, and the output socket 4 which is mounted on an upper face (the first face) 101 of the printed circuit board 1 and protrudes upwards from the housing recess 20. The input socket 3 and the output socket 4 respectively have conductive pins 31 and conductive pins 41, as conductive parts, which are formed of metal and inserted to be mounted to the printed circuit board 1. The conductive pins 31 of the input socket 3 are electrically connected to the input terminal 11 of the power supply circuit. The conductive pins 41 of the output socket 4 are electrically connected to the output terminal 12 of the power supply circuit.

The input socket 3 is configured to be detachably connected to an input plug 73 provided on a second end of an input cable 71 of which first end is connected to the power source. Specifically, the input socket 3 constitutes, together with the input plug 73, known connectors. By connecting the input plug 73 to the input socket 3, the power source and the printed circuit board 1 (specifically, the input terminal 11 of the power supply circuit) are electrically connected to each other via the input cable 71. The input plug 73 and the input socket 3 are detachably connected with each other by a known means, such as fitting structure or male-female coupling structure.

The output socket 4 is configured to be detachably connected to an output plug 74 provided on a second end of an output cable 72 of which first end is connected to the light source 61 via the igniter 62. Specifically, the output socket 4 constitutes, together with the output plug 74, known connectors. By connecting the output plug 74 to the output socket 4, the light source 61 and the printed circuit board 1 (specifically, the output terminal 12 of the power supply circuit) are electrically connected to each other via the output cable 72 and the igniter 62. The output plug 74 and the output socket 4 are detachably connected with each other by a known means, such as fitting structure or male-female coupling structure.

Figure 4:
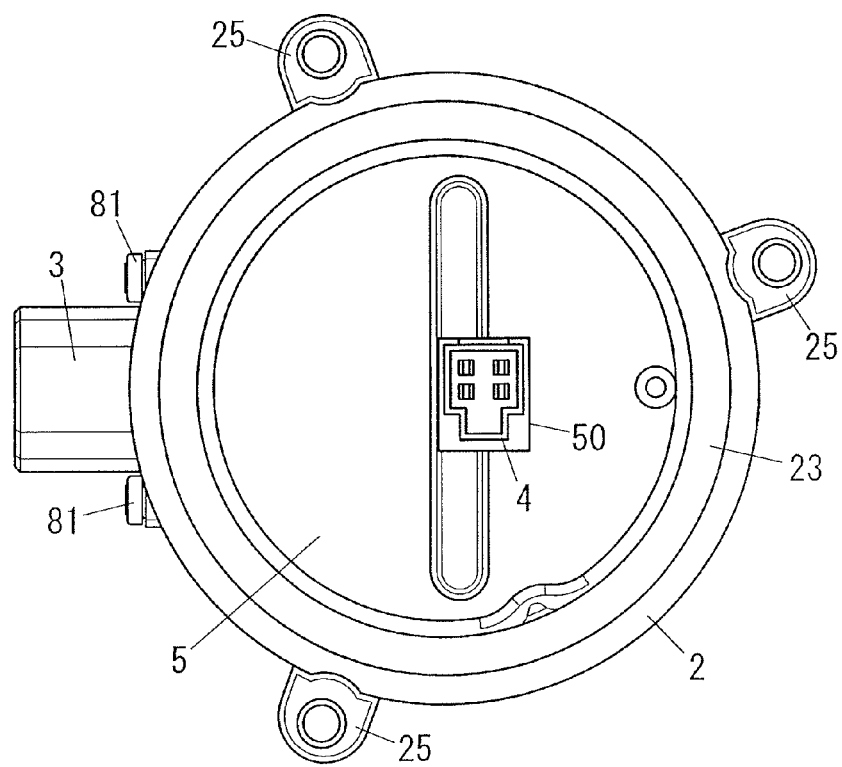
FIG. 4 is a plan view of the power supply device.

As shown in FIGS. 1 and 4, the power supply device of the embodiment includes the cover 5 having a shape avoiding the interference with the output socket 4, and is coupled to the casing 2 to close the housing recess 20. Specifically, the cover 5 is shaped like a plate provided with the insertion hole 50 which has a shape (a rectangle, in the embodiment) corresponding to a peripheral shape of the output socket 4. The cover 5 is attached to the casing 2 to cover the housing recess 20. The cover 5 is formed of a metal plate, and is coupled to the casing 2 with screws, for example.

A rib 23 protrudes sideways from a whole outer face, at a position lower than an opened end of the housing recess 20, of the casing 2. Part of the casing 2 above the rib 23 is to be inserted into the inside of the lamp body 6. A packing 82 formed of flexible material such as elastomer and shaped like a ring is intervened between the rib 23 and a lower face of the lamp body 6 so as to surround the casing 2. When the casing 2 is fixed to the lamp body 6, a gap between the lamp body 6 and the casing 2 is closed by the packing 82. It is accordingly possible to prevent the intrusion of water and the like into the lamp body 6 and the casing 2. The casing 2 and the lamp body 6 can be fixed to each other by known means such as screwing, for example.

Figure 3:
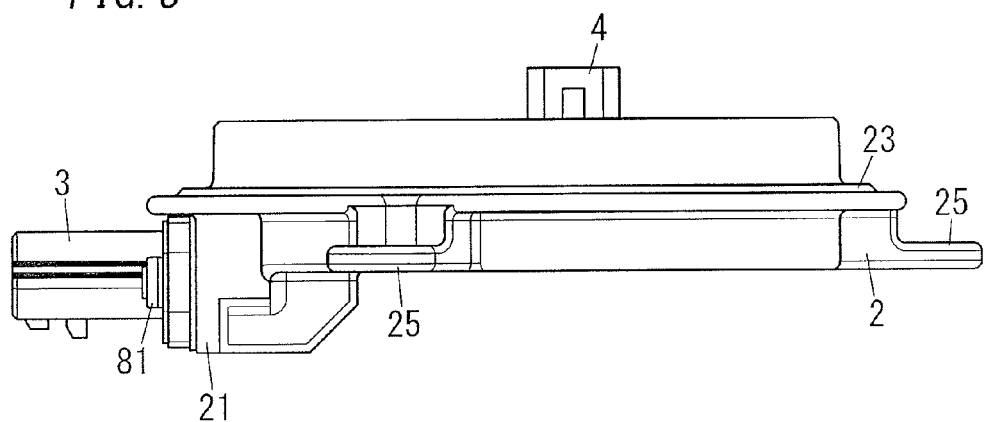
FIG. 3 is a front view of the power supply device.

The bulge part 21 is provided on the one end part (a left end part in FIG. 1) of the bottom 200 of the casing 2 to further bulge downwards (namely, to an opposite side to the protruding side of the output socket 4) than the rest of the bottom 200. A lower face of part 201 of the bottom 200 of the casing 2 other than the bulge part 21 is flattened (hereinafter, this part 201 is also called a "flat part"). As shown in FIGS. 3 and 4, two or more (three, in FIG. 4) screw receiving parts 25 protrude sideways from an outer peripheral face of the casing 2. The screw receiving part(s) 25 would be used for fixing the casing 2, with screws, to an external attachment surface (not shown) while the lower face of the part (the flat part) 201 other than the bulge part 21 is in contact with the attachment surface. The lower face of the part 201 other than the bulge part 21, of a lower face of the casing 2, is positioned above a lower end face 301 of the input socket 3.

The dimension of the bulge part 21 is set as small as possible under conditions that a gap securing desired electrical insulation is formed between the conductive pins 31 of the input socket 3 and an inner surface of the bulge part 21 as well as the bulge part 21 having a thickness ensuring desired mechanical strength. The countersink portion 24 to which the printed circuit board 1 is fixed is provided at the part (the flat part) 201 other than the bulge part 21.

That is to say, the casing 2 is shaped like a bottomed cylinder which has the bottom 200 and a side 210 and one face (an upper face) of which is opened, as shown in FIG. 1. The casing 2 is provided with the housing recess 20 that accommodates the printed circuit board 1. The printed circuit board 1 has the first face 101 and the second face 102 on both sides in the thickness direction thereof. The printed circuit board 1 is disposed in the housing recess 20 with the second face 102 facing the bottom 200. The bottom 200 of the casing 2 includes the flat part 201 shaped like a flat plate. The printed circuit board 1 is disposed in the casing 2 so as to be substantially in parallel to the flat part 201.

The casing 2 has, at the one end part thereof in the direction (the right-left direction in FIG. 1) perpendicular to the thickness direction of the printed circuit board 1, the bulge part 21 that protrudes outwards in the thickness direction of the printed circuit board 1 (i.e., protrudes to a side apart from the printed circuit board 1). The input socket 3 is fixed to the bulge part 21. In other words, the input socket 3 is fixed to the casing 2 with at least part of the input socket 3 facing the bulge part 21.

Figure 2:
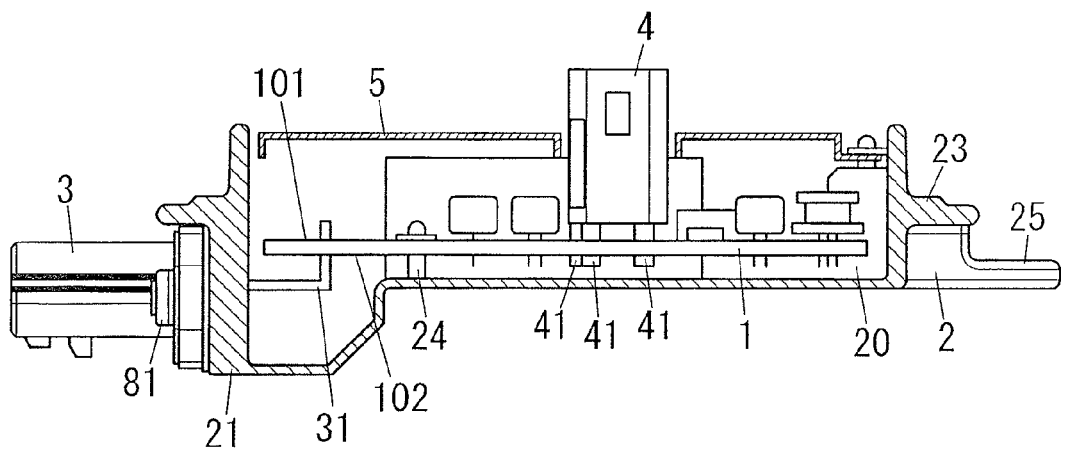
FIG. 2 is a sectional view of the power supply device.

As shown in FIG. 1, the dimension between a lower face of the rib 23 and a lower face of the bulge part 21 is substantially the same as the dimension of the input socket 3 in the vertical direction (the thickness direction of the printed circuit board 1). As shown in FIG. 2, a side wall 211 of the bulge part 21 (part of the casing 2 to which the input socket 3 is fixed) has a thickness larger than that of the rest of the casing 2. Accordingly, it is possible to prevent the deformation of the casing 2 caused by the unstability of the input plug 73.

As shown in FIG. 1, the lower face (an outer face) of the flat part 201 is positioned above the lower end face 301 of the input socket 3. In other words, the position of the lower face of the flat part 201 is closer to the lamp body 6 than the position of a face 301 which is a part of the input socket 3 farthest from the lamp body 6. As shown in FIG. 2, the first face 101 of the printed circuit board 1 is in substantially the same plane as an upper end face of the input socket 3.

With the above configuration, part of the casing 2 that is required to have the dimension agreed with the dimension of the input socket 3 is the bulge part 21 only, in the vertical direction (the thickness direction of the printed circuit board 1). Accordingly, it is possible to reduce the size of the casing 2 in comparison with a case where whole dimension of a casing 2 is agreed with the dimension of an input socket 3 in the vertical direction.

Figure 5:
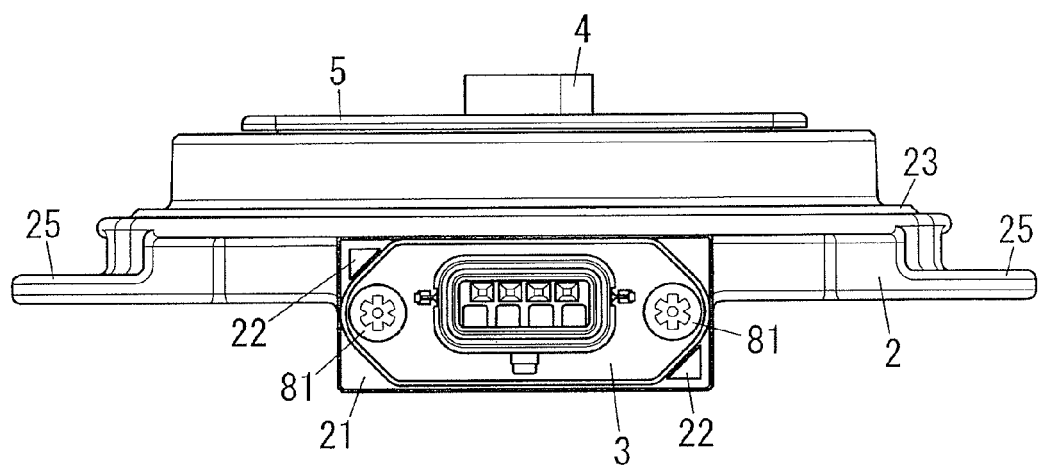
FIG. 5 is a side view of a power supply device according to a variation of the embodiment.

The input socket 3 is fixed to the bulge part 21 with two screws 81. Therefore, it is preferable that the bulge part 21 be provided with rotation-inhibition-protrusions 22 configured to be brought into contact with the input socket 3 to inhibit the input socket 3 from rotating, with respect to the casing 2, around the axis of the screw 81, as shown in FIG. 5. In the example of FIG. 5, the rotation-inhibition-protrusions 22 are respectively provided on the upper left and lower right sides of a part to which the input socket 3 is fixed, so that the rotation-inhibition-protrusions 22 are positioned on clockwise direction of the input socket 3 as seen from a side of a head of the screw 81 (seen from the front of the sheet of FIG. 5). With this configuration, it is possible to prevent the input socket 3 from rotating along with fastening of the screw 81.

The invention claimed is:

1. A power supply device, comprising:
   a printed circuit board on which a power supply circuit is mounted;
   a casing which houses the printed circuit board;
   an input socket which is fixed to one end part, in a direction perpendicular to a thickness direction of the printed circuit board, of the casing, and is electrically connected to an input terminal of the power supply circuit; and
   an output socket which is electrically connected to an output terminal of the power supply circuit and protrudes from one side, in the thickness direction of the printed circuit board, of the casing,
   wherein a bulge part is provided on the one end part of the casing to further protrude therefrom than rest of the casing towards the opposite side to the output connector, and the input socket is fixed to the bulge part.

2. The power supply device according to claim 1, wherein
   the input socket is fixed to the casing by a screw that engages with the casing, and
   the casing is provided with a rotation-inhibition-protrusion configured to be brought into contact with the input socket to inhibit the input socket from rotating along with fastening of the screw.

3. The power supply device according to claim 1 or 2, wherein
   the casing is made of metal, and
   a gap is provided between a conductive part, which is electrically connected to the printed circuit board, of the input socket and an inner surface of the bulge part so that electrical insulation between the conductive part and the casing is secured.

4. The power supply device according to claim 1, wherein
   the power supply circuit is configured to output an AC power for lighting a discharge lamp.

5. The power supply device according to claim 1, wherein
   the power supply circuit is configured to output a DC power for lighting a light-emitting diode.

6. An in-vehicle illumination device, comprising:
   the power supply device according to claim 1;

a light source configured to be lit by an output of the power supply device; and a lamp body which is fixed to the casing and which houses the light source and into which the output socket is inserted.

* * * * *